(12) United States Patent
Iha

(10) Patent No.: US 6,623,906 B2
(45) Date of Patent: *Sep. 23, 2003

(54) PHOTOSENSITIVE GLASS PASTE AND METHOD FOR MANUFACTURING MULTILAYERED INTERCONNECTED CIRCUIT BOARD USING THE SAME

(75) Inventor: Michiaki Iha, Kusatsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/757,869

(22) Filed: Jan. 10, 2001

(65) Prior Publication Data

US 2001/0014429 A1 Aug. 16, 2001

(30) Foreign Application Priority Data

Jan. 31, 2000 (JP) .......................................... 2000-021905

(51) Int. Cl.[7] .............................. G03C 1/725; G03C 1/73
(52) U.S. Cl. ................................. 430/270.1; 430/281.1; 430/286.1
(58) Field of Search ........................ 430/270.1, 281.1, 430/286.1

(56) References Cited

U.S. PATENT DOCUMENTS

| | | | | |
|---|---|---|---|---|
| 6,117,614 A | * | 9/2000 | Takahashi et al. | 430/270.1 |
| 6,197,480 B1 | * | 3/2001 | Iguchi et al. | 430/286.1 |
| 6,326,125 B1 | * | 12/2001 | Kakinuma et al. | 430/281.1 |
| 6,365,265 B1 | * | 4/2002 | Tose et al. | 428/210 |
| 6,403,694 B1 | * | 6/2002 | Tose et al. | 524/493 |

FOREIGN PATENT DOCUMENTS

| | | |
|---|---|---|
| EP | 1024405 A1 | 8/2000 |
| JP | 10-120432 | 2/1998 |
| JP | 10-120432 | 5/1998 |
| JP | 11-120823 | 4/1999 |
| JP | 2000-01836 | * 1/2000 |
| JP | 2000-063151 | * 2/2000 |
| JP | 2000-191945 | * 7/2000 |
| JP | 2000-347394 | * 12/2000 |

OTHER PUBLICATIONS

English abstract and partial machine translation of JP 10–120432.*
English abstract of JP 2000–016836.*
English abstract of JP 2000–063151.*
English abstract of JP 2000–347394.*
English abstract of JP 2000–191945.*
WPI Abstract No. 1998–328269 of JP100120432A (Toray).
English abstract of JP 11–120823.
English abstract of JP 10–120432.
Copy of Japanese Examination Report dated Feb. 25, 2003 (and English translation of same).

* cited by examiner

*Primary Examiner*—Janet Baxter
*Assistant Examiner*—Amanda C. Walke
(74) *Attorney, Agent, or Firm*—Dickstein, Shapiro, Morin & Oshinsky, LLP.

(57) ABSTRACT

A photosensitive glass paste containing: an inorganic component containing a glass powder and a photosensitive organic component is provided. The glass powder contains about 1 to 30 percent by weight of a low melting point glass powder having a glass softening point in a range of about 400° C. to 600° C. and about 70 to 99 percent by weight of a high melting point glass powder having a glass softening point about 300° C. or more higher than the glass softening point of the low melting point glass. As the high melting point glass, a borosilicate glass which inhibits diffusion of a conductive component such as Ag is employed. The content of the inorganic component in the photosensitive glass paste is in a range of about 40 to 70 percent by weight. A method of manufacturing a multilayered interconnected circuit board using the above-described photosensitive glass paste is also provided.

13 Claims, 1 Drawing Sheet

PHOTOSENSITIVE GLASS PASTE AND METHOD FOR MANUFACTURING MULTILAYERED INTERCONNECTED CIRCUIT BOARD USING THE SAME

BACKGROUND OF THE INVENTION

1. Field of the Invention

The present invention relates generally to a photosensitive glass paste which is cured by exposure to light, particularly for making an insulation layer in multilayered electronic device, and to a method for manufacturing a multilayered interconnected circuit board using the glass paste.

2. Description of the Related Art

Conventionally, semiconductive elements, such as ICs, etc., are used mounted on a printed circuit board in which an insulating layer having a through hole is formed by processes such as printing processes, etc., on a glass epoxy resin board having fine wiring on the surface thereof.

In recent years, as the demand for high integration, fine interconnection, high speed transmission, high frequency and rapid heat dissipation increases for semiconductor elements, the demand for a printed circuit board capable of accommodating such needs has also increased.

The conventional printed circuit board, however, does not have satisfactory characteristics regarding workability, platability of through holes, adhesive property among layers, etc., resulting in problems. Also, there is a problem of thermal deformation at high temperatures in the above described glass epoxy resin board and there is a limit to increases in density.

In view of the above, a ceramic substrate which uses a ceramic having a high mechanical strength and a high thermal resistance, such as alumina, is considered to be desirable.

As a ceramic substrate, there may be mentioned a printed substrate having fine wiring on the surface thereof and having an insulating layer with through holes formed by the printing techniques, etc., on the surface thereof. In this type of printed substrate, it may sometimes be necessary to form fine through holes in order to accommodate high density packaging.

Also, in recent years, multilayer-type inductors capacitors, etc., formed by laminating a ceramic green sheet provided with electrodes (coil patterns) are being increasingly used. As the level of integration of electronic circuits increases, passive devices such as inductors, capacitors, etc., are also required to be miniaturized.

A spiral multilayer coil capable of yielding high inductance, for example, is manufactured by repeatedly forming an insulating layer, with via holes, on a ceramic green sheet (alumina green sheet) provided with a coil pattern, filling a conductor into the via hole, stacking another ceramic green sheet on the insulating layer, and connecting the coil pattern of the first layer and the coil pattern of the second layer via the via holes. When a coil is manufactured using this process, it is necessary to form fine through holes in order to achieve miniaturization of the product.

In response to the trends to higher density and miniaturization of the multilayer circuit components, a method of forming an insulating layer by using a photosensitive glass paste has been proposed, by which fine via holes which have been difficult to form by conventional printing techniques can be formed.

In this method, a photosensitive glass paste is applied on the entire surface of the substrate by way of screen-printing, etc. The applied photosensitive glass paste is dried, is then exposed and developed through a photomask, and is fired so as to form the fine via holes.

It is to be noted that, the photosensitive glass paste used in this method is a mixture of a photosensitive organic material and an inorganic mixture containing a glass or both a glass and a ceramic. As the inorganic mixture, a mixture in which ceramic material such as quartz, cordierite, alumina, zirconia, mullite, spinel, forsterite and silica are added to the glass at a predetermined proportion is generally used. As the photosensitive organic material, one including a polymer having a functional group in the side chain thereof, a photoreactive compound (monomer), a photopolymerization initiator, a solvent, etc., is generally used.

The conventional photosensitive glass paste, however, usually contains only one kind of glass component having a relatively low glass softening point. Thus, viscous flow is initiated at a low temperature, resulting in a large shrinkage ratio due to sintering and the diameter of the formed via hole will be significantly larger than the diameter after development. Another problem is that during the step of firing, the amount of Ag from the conductive leads made of Ag which constitute the circuit diffusing into the glass is large, degrading insulating characteristics between the layers.

In contrast, when the glass component of the photosensitive glass paste includes only a high melting point glass, as the photosensitive glass paste is treated with heat in the range of the optimum firing temperature so as not to cause deformation of conductive leads made of Ag and Cu, there are problems of insufficient sintering and degradation of insulative properties.

Japanese Unexamined Patent Application Publication 10-120432 discloses a photosensitive glass paste for use in plasma displays, in which a high melting point glass is added to a low melting point glass. Because the content of the low melting point glass is high (40 to 97 percent by weight), when this photosensitive glass paste is employed in a multilayered interconnected circuit board, deformations of via holes due to shrinkage cannot be avoided. Also, because viscous flow of the low temperature glass occurs at low temperatures, a conductor such as Ag will diffuse, causing the insulation properties between layers to degrade. Furthermore, because the functional group, such as carboxyl group, in the photosensitive organic component reacts with polyvalent metal such as boron contained in the glass component, the polymer chains are cross-linked and the viscosity of the paste is abnormally increased, resulting in gelation.

SUMMARY OF THE INVENTION

Accordingly, it is an object of the present invention to provide a photosensitive glass paste which is not susceptible to gelation, shrinkage due to sintering and diffusion of conductor compositions such as Ag, by which a glass layer having via holes of precise predetermined shape and size can be formed at predetermined positions. Another object of the present invention is to provide a method for manufacturing a multilayered interconnected circuit board using the photosensitive glass paste.

In order to achieve the above objects, a photosensitive glass paste is provided comprising an inorganic component including a glass powder, and a photosensitive organic component, in which the glass powder comprises (a) about 1 to 30 percent by weight of a low melting point glass powder having a glass softening point in a range of about 400° C. to 600° C. and (b) about 70 to 99 percent by weight of a high melting point glass powder having a glass softening point about 300° C. or more higher than the softening point of the low melting point glass powder.

Because the glass component which constitutes the main portion of the inorganic component of the photosensitive glass paste of the present invention contains a high melting point glass as the main component thereof and limits the proportion of the low melting point glass to be less, shrinkage due to sintering, diffusion of conductive components such as Ag, and gelation can be prevented.

Also, by using this photosensitive glass paste, for example, a glass layer having via holes of desired size can be reliably formed.

The photosensitive glass paste of the present invention uses about 1 to 30 percent by weight of a low melting point glass powder having a glass softening point in a range of about 400° C. to 600° C. The reason for using this type of glass powder is that when the glass softening point is lower than about 400° C., diffusion of metal contained in the leads occurs, causing defects in the insulating layers (degradation of insulating properties), and when the glass softening point exceeds about 600° C., the glass paste remains unsintered. The reason for setting the proportion of the low melting point glass powder to about 1 to 30 percent by weight is that when the proportion of the low melting point glass powder is less than about 1 weight percent, sintering is not performed satisfactorily and bubbles remain in the insulating layers causing insulation failure between layers of the multilayer circuit, and when the proportion of the low melting point glass powder exceeds about 30 percent by weight, patterns may be deformed after firing, and metal used in the lead may diffuse into the glass, causing insulation failure. When the proportion of the high melting point glass powder exceeds about 99 percent by weight, sintering is not performed satisfactorily and bubbles remain in the insulating layers, causing insulation failure between layers of the multilayer circuit.

When a high melting point glass powder which satisfies the conditions of the present invention, i.e., the high melting point glass powder having a glass softening point ($T_S$) of about 300° C. or more higher than that of the low melting point glass powder, is used, by firing at a temperature about 10° C. to 100° C. higher, preferably about 20° C. to 30° C. higher, than the glass softening point ($T_S$) of the high melting point glass, the viscosity of the low melting point glass is appropriately decreased, promoting sintering. Thus, sintering can be performed easily and reliably. In addition, because the viscosity of the high melting point glass is not decreased as much at the time of firing, deformation in the shape of the pattern can be prevented.

It is to be noted that when the difference between the glass softening point of the low melting point glass and the glass softening point of the high melting point glass is less than about 300° C., the low melting point glass does not flow properly, inhibiting sintering, even when the firing temperature is set to a temperature about 20° C. to 30° C. higher than the glass softening point of the high melting point glass. When the firing temperature is increased so that the low melting point glass may flow properly, the viscosity of the high melting point glass is reduced and the entire glass paste layer may flow, resulting in deformation of the pattern shape.

As described above, a low melting point glass having a glass softening point in a range of about 400° C. to 600° C. is preferably used as the low melting point glass. More preferably, a low melting point glass having a glass softening point in the range of about 450° C. to 550° C. is used.

Preferably, the photosensitive glass paste of the present invention includes a high melting point glass powder comprising an $SiO_2$—$B_2O_3$—$K_2O$ type (borosilicate type) glass powder in which the proportion in weight of $SiO_2$, $B_2O_3$ and $K_2O$ is in a region surrounded by point A (65, 35, 0), B (65, 25, 10), C (85, 5, 10) and D (85, 15, 0) in a ternary diagram shown in FIG. 1.

In the above described high melting point glass powder, the proportion of $SiO_2$, which has a low reactivity with an organic binder, is high and the proportion of the composition (boron, in particular) having a high reactivity with an organic vehicle, particularly with a photosensitive organic binder having an acid functional group such as a carboxyl group, is relatively low. Thus, changes in viscosity of the photosensitive glass paste over time due to ionic cross-linking reactions are prevented, layers can be uniformly formed by using various techniques, and fine via holes, etc., having highly precise forms can be readily formed by a photolithographic technique.

An insulating body layer formed of a glass paste (insulating material) comprising a borosilicate glass of the above composition as the main component thereof displays superior characteristics, i.e., the relative dielectric constant $\in_r$ is as low as 5 or less and insulation reliability in wet load testing is as high as $1 \times 10^9$ or more (log IR≧9).

Furthermore, because a borosilicate glass capable of inhibiting the diffusion of a conductor component such as Ag is employed as the high melting point glass, it is possible to reduce the diffusion of metal (conductive component) used in leads and to decrease the conductivity of the glass layer. Thus, by using the photosensitive glass paste of the present invention, a multilayer electronic component, circuit or the like having less transmission loss can be formed.

By optimally varying the composition proportion of $SiO_2$, $B_2O_3$ and $K_2O_3$ within the region surrounded by points A, B, C, and D in FIG. 1, it is possible to control the desired thermal expansion coefficient corresponding to the types of substrate material and conductive material within the range of, for example, 1.5 to 9 ppm/° C. Accordingly, warpage of the substrate may be minimized, the deformation of the substrate may be decreased when layers are stacked and a thick film multilayered interconnected circuit board of high reliability can be obtained.

In region X shown in FIG. 1, the insulating resistance in wet load testing is lower and the insulation reliability is likely to decrease. In region Y shown in FIG. 1, the relative dielectric constant $\in_r$ is high, and such a glass paste is not suitable for an insulating body layer of the thick multilayered interconnected circuit board for high frequency use. In region Z shown in FIG. 1, the sintering temperature for forming insulating layers is increased, and a low melting metal having a low specific resistance such as gold and copper will be difficult to fire simultaneously, thereby decreasing productivity.

Preferably, the composition of the $SiO_2$—$B_2O_3$—$K_2O$ type glass is in the region surrounded by points E (75, 25, 0), F (75, 20, 5), G (85, 10, 5) and D (85, 15, 0) in FIG. 1.

More preferably, a photosensitive glass paste of the present invention includes a high melting point glass powder comprising a mixed powder containing the above-described $SiO_2$—$B_2O_3$—$K_2O$ type glass and a $SiO_2$—$B_2O_3$—$Al_2O_3$ type glass having a composition of about 93.5 to 97.8 percent by weight $SiO_2$, about 2.0 to 5.0 percent by weight $B_2O_3$ and about 0.2 to 1.5 percent by weight $Al_2O_3$.

By using a mixture of a borosilicate glass having a composition within the region surrounded by points A, B, C and D in FIG. 1 and a $SiO_2$—$B_2O_3$—$Al_2O_3$ type glass (high silica content silicate glass) comprising about 93.5 to 97.8 percent by weight $SiO_2$, about 2.0 to 5.0 percent by weight $B_2O_3$ and about 0.2 to 1.5 percent by weight $Al_2O_3$, shrinkage of the paste due to firing can be inhibited and changes in the pattern shape due to firing can be minimized. Also, by using a high melting point glass having the above composition, viscous flow of glass is inhibited, via holes are prevented from being enlarged and a glass layer having a desired pattern may be formed on an insulating layer.

Also, by adjusting the proportions of the above-described borosilicate glass and the high silica content silicate glass, the thermal expansion coefficient of the insulating body layer and that of the substrate may be controlled to coincide so as to yield a multilayer circuit substrate with less warpage.

Preferably, the proportion of the high silica content silicate glass is adjusted to be about 15 to 35 percent by weight, and more preferably about 20 to 30 percent by weight, relative to 100 percent by weight of the borosilicate glass.

The above-described high silica content silicate glass has a high glass softening point ($T_S$) and does not soften at the temperature at which the photosensitive glass paste, the product, is fired. The high silica content silicate glass not only functions as a filler for restraining shrinkage due to firing but also restrains the scattering of light and enhances the curing rate of the photosensitive glass paste because the refractive index thereof is close to the refractive index of the organic binder and the borosilicate glass.

Furthermore, because a high silica content silicate glass powder is easy to manufacture and the price thereof is stable, a high silica content silicate glass powder of reliable quality can be obtained at a lower cost.

The high silica content silicate glass powder has satisfactory wettability with the above-described borosilicate glass powder. Thus, sinterablilty can be enhanced and a densely sintered body can be formed.

When the above-described high silica content silicate glass has less $SiO_2$ than that in the above region, the glass softening point will be lower and the refractive index will be higher. Thus, the difference in refractive index with other materials occurs in some part, scattering of light in those parts is increased, and the curing rate of the photosensitive glass paste may be undesirably lowered. When the content of $SiO_2$ is higher than the above-described range, vitrification is difficult, resulting in increased cost.

Preferably, the photosensitive glass paste of the present invention includes about 40 to 70 percent by weight of the above-described inorganic component.

By setting the proportion of the inorganic component to the range of about 40 to 70 percent by weight, a photosensitive glass paste of superior quality can be obtained. That is, there is less shrinkage of the applied paste due to firing, voids are not significantly formed by firing, the insulation reliability of the formed layer is high and curing properties of layers are excellent.

When the inorganic component is less than about 40 percent by weight, it will be difficult to form a uniform layer due to the significant shrinkage by firing, and insulation reliability is degraded due to an increased number of voids. When the inorganic component exceeds about 70 percent by weight, scattering and absorption of light in the paste layers are increased at the time of development, causing the amount of light passing through the layers to be insufficient and a layer curing rate to decrease.

A method for manufacturing a multilayered interconnected circuit board of the present invention comprises: a step for printing the photosensitive glass paste on the insulating substrate having conductive leads formed thereon and drying the applied photosensitive glass paste; a step of forming a via hole pattern by exposing and developing the printed and dried photosensitive glass paste; and a step of forming an insulating layer with via holes by filling a conductive paste into the via hole pattern and firing the same.

Because the glass component which constitutes the main portion of the inorganic component of the photosensitive glass paste of the present invention contains a high melting point glass as the main component thereof and limits the proportion of the low melting point glass, by using this type of photosensitive glass paste, shrinkage due to firing can be prevented, diffusion of the conductive component such as Ag can be inhibited and a thick film multilayer circuit substrate of high reliability can be efficiently manufactured.

Furthermore, because the above-described manufacturing method employs the photosensitive glass paste of the present invention in order to form an insulating layer with via holes, shrinkage due to firing and diffusion of conductive component such as Ag can be inhibited. Thus, a thick film multi-layered interconnected circuit board of high reliability can be efficiently manufactured.

DESCRIPTION OF THE PREFERRED EMBODIMENTS

Figure 1:
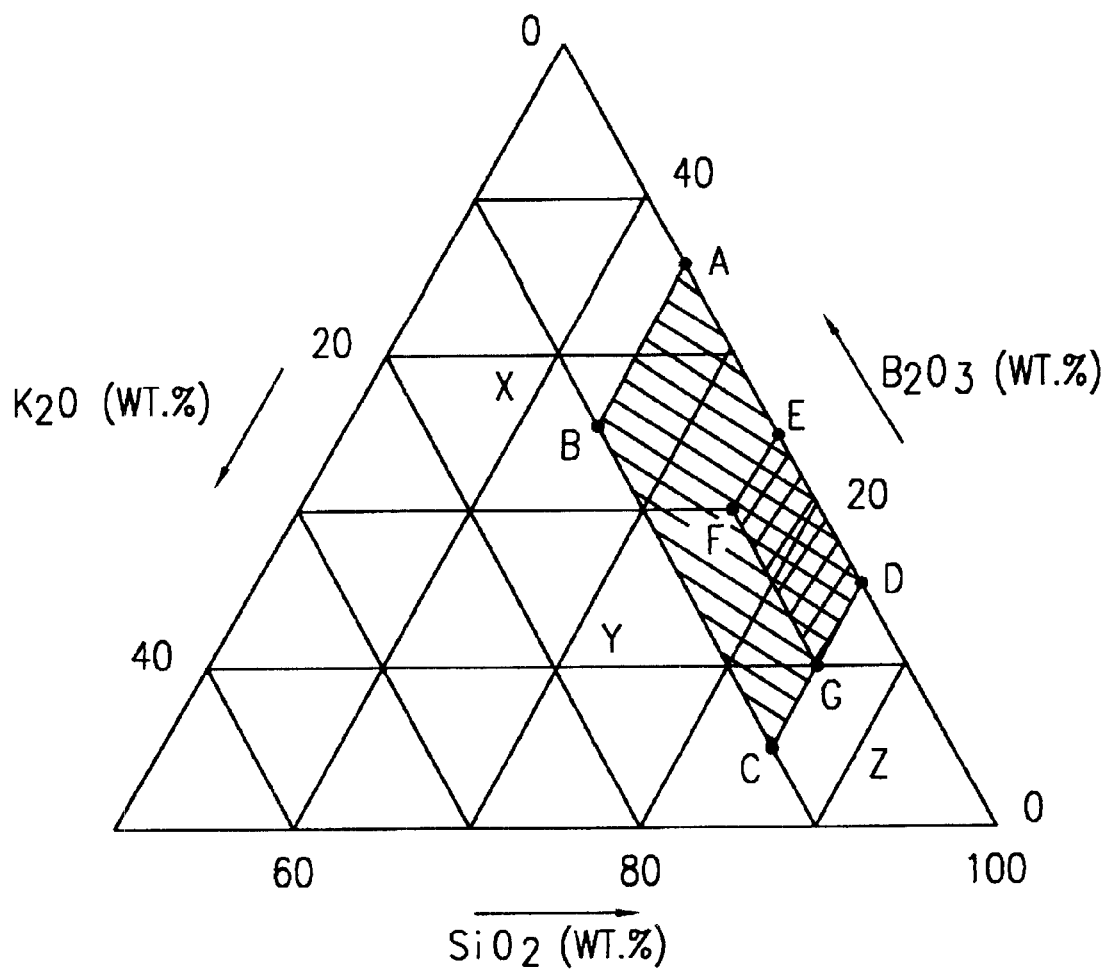
FIG. 1 is a ternary diagram showing composition regions of borosilicate glass of the present invention.

Now, the present invention will be described in detail by way of embodiments.

Preparing Photosensitive Glass Paste

First, a low melting point glass having a glass softening point in a range of about 400° C. to 600° C. is added to a high melting point glass having a glass softening point of about 300° C. or more higher than that of the low melting point glass so that the proportion of the low melting point glass relative to the mixture of ceramic particles and crystalline particles is about 1 to 30 percent by weight of the entire inorganic component.

As ceramic particles, dielectric ceramics such as $BaTiO_3$, magnetic ceramics such as ferrite, and other various types of materials can be employed. As crystalline particles, quartz can be employed.

The amount of the ceramic particles is preferably about 10 to 25 percent by weight of the entire amount of the inorganic component.

Each of the high melting point glass and low melting point glass may include only one type of glass or a mixture of several types of glass.

The average grain diameter of respective powders such as the high melting point glass powder, the low melting point glass powder, the ceramic particles, and the crystalline particles is in a range of about 1 to 10 μm, preferably about 1 to 4 μm.

A photosensitive organic component is then added to the inorganic component at a predetermined proportion and is mixed. The amount of the photosensitive organic component is controlled so that the proportion of the inorganic component is in a range of about 40 to 70 percent by weight.

In this embodiment, a copolymer of methylmethacrylate and methacrylic acid, monomer, photopolymerization initiator and solvent were used.

The mixture of the inorganic component and the photosensitive organic component is thoroughly dispersed by a three-roller-mill to yield a photosensitive glass paste. Preferably, the photosensitive glass paste contains about 40 to 70 percent by weight, and more preferably 50 to 55 percent by weight of the inorganic component.

Manufacturing Multilayered Interconnected Circuit Board

First, an alumina substrate for a multilayered interconnected circuit board is prepared. On the alumina substrate, a conductive paste is applied by screen printing by using a screen sheet having a predetermined pattern, and is then dried and fired so as to form a conductive lead on the surface of the alumina substrate.

A conductive paste comprising metal such as Au, Pt, Ag, Cu, Ni, Pd, W, etc., as a conductive component can be employed, and there is no specific limitation to the type thereof.

The photosensitive glass paste manufactured as above is then applied on the entire alumina substrate having a conductive lead by means of screen-printing, spin coating, etc., and is dried. The photosensitive glass paste is then exposed through a photomask having a via hole pattern so as to expose part of the conductive lead, and is developed. Then, firing is performed so as to form an insulating layer (film) having via holes of predetermined size and shape at the predetermined positions on the alumina substrate having a conductive lead.

The conductive paste is then applied by screen printing on the formed insulating layer with a desired pattern while filling via holes with conductive paste. In this manner, since the via holes are filled with conductive paste and a conductive lead pattern is formed on the insulating layer, the circuits of the first layer and the second layer are serially connected. These are then dried and fired in the above-described conditions.

By repeating the above-described steps, a multilayered interconnected circuit board having a predetermined number of layers is manufactured.

on a weight basis is prepared as a low melting point glass. Two types of glass having a glass softening temperature about 300° C. or more higher than the glass softening point of the low melting point glass are prepared as high melting point glasses. The first high melting point glass comprises $SiO_2:B_2O_3:K_2O=79:19:2$ and the second high melting point glass comprises $SiO_2:B_2O_3:Al_2O_3=96:2.5:1.4$. For the purpose of comparison, a comparative high melting point glass in which the ratio by weight of $SiO_2:B_2O_3:Al_2O_3:Na_2O:MgO:CaO=72.6:0.8:1.7:15.2:3.6:4.6$ having a softening temperature 216° C. higher than that of the low melting point glass is prepared.

TABLE 1

| | Component | Glass Softening Temperature |
|---|---|---|
| Insulating Powder | Borosilicate Glass: First High Melting Point Glass ($SiO_2:B_2O_3:K_2O = 79:19:2$) | 780° C. |
| | Borosilicate Glass: Second High Melting Point Glass ($SiO_2:B_2O_3:Al_2O_3 = 96:2.5:1.4$) | 1500° C. |
| | Corning 0080: Comparative High Melting Point Glass ($SiO_2:B_2O_3:Al_2O_3:Na_2O:MgO:CaO = 72.6:0.8:1.7:15.2:3.6:4.6$) | 696° C. |
| | Borosilicate Glass: Low Melting Point Glass ($Bi_2O_3:B_2O_3:Al_2O_3:SiO_2 = 73.9:22.2:3.2:1:4$) | 480° C. |
| | Quartz | — |

The glass softening point of each glass material is also shown in Table 1.

The low melting point glass is added to these high melting point glasses or to the comparative high melting point glass at a proportion of 0.6 to 35 percent by weight, as shown in Table 2. Quartz is added so as to adjust the mixture of the inorganic component.

TABLE 2

| Sample | Amount of First High Melting Point Glass (in weight %) | Amount of Second High Melting Point Glass (in weight %) | Amount of Comparative High Melting Point Glass (in weight %) | Amount of Low Melting Point Glass (in weight %) | Amount of Quartz (in weight %) | Ratio by weight of High Melting Point Glass to the Low Melting Point Glass |
|---|---|---|---|---|---|---|
| A* | 65.6 | 17.9 | — | 0.5 | 16 | 99.4:0.6 |
| B | 65.2 | 17.8 | — | 1.0 | 16 | 98.8:1.2 |
| C | 64.0 | 17.5 | — | 2.5 | 16 | 97.0:3.0 |
| D* | — | 17.5 | 64.0 | 2.5 | 16 | 97.0:3.0 |
| E | 81.5 | — | — | 2.5 | 16 | 97.0:3.0 |
| F* | — | — | 81.5 | 2.5 | 16 | 97.0:3.0 |
| G | 54.2 | 14.8 | — | 15.0 | 16 | 82.1:17.9 |
| H | 46.2 | 12.6 | — | 25.2 | 16 | 70.0:30.0 |
| I* | 38.5 | 10.5 | — | 35.0 | 16 | 58.3:41.7 |
| J* | 0 | 0 | — | 80 | 20 | 0:100 |

EXAMPLES

Now, the present invention will be more specifically described by way of examples.

Preparing Photosensitive Glass Paste

As shown in Table 1, a borosilicate glass having a composition of $Bi_2O_3:B_2O_3:Al_2O_3:SiO_2=73.9:22.2:3.2:1.4$ It is to be noted that the average grain diameters of the first high melting point glass, the second high melting point glass, the comparative high melting point glass, the low melting point glass, and quartz were 4 μm, 3 μm, 3 μm, 1 μm, and 2 μm, respectively In Table 2, asterisked samples A, D, F, I, and J are the samples of comparative examples having compositions outside the range of the present invention.

A photosensitive glass paste was adjusted by mixing each of the materials below in the proportions below.

(a) Copolymer of methylmethacrylate and methacrylic acid: 7 parts by weight (14 percent by weight)
(b) Monomer (ethylene oxide modified trimethylolpropane triacrylate): 14 parts by weight (28 percent by weight)
(c) Initiator (2-methyl-1-[4-(methylthio)phenyl]-2-morpholinopropane-1-one): 2 parts by weight (4 percent by weight)
(d) Solvent (ethylcarbitol acetate): 27 parts by weight (54 percent by weight)

Then, as shown in Table 3, 50 parts by weight of the inorganic component (insulating powder) of Table 2 and 50 parts by weight of the above described photosensitive organic component are mixed thoroughly by a three roller mill to manufacture a photosensitive glass paste.

TABLE 3

| | Component | Parts by weight |
|---|---|---|
| Insulating Powder | Inorganic Component having Composition of Table 2 | 50 |
| Photosensitive Organic Component | Copolymer of methylmethacrylate and methacrylic acid: 7 parts by weight Monomer (modified trimethylolpropane triacrylate): 14 parts by weight Photopolymerization initiator (2-methyl-1-[4-(methylthio)phenyl]-2-morpholinopropane-1-one): 2 parts by weight Solvent (ethylcarbitol acetate): 27 parts by weight | 50 |

Manufacture of Multilayered Interconnected Circuit Board

Next, a method for manufacturing a multilayered interconnected circuit board by using the above-described photosensitive glass paste will be explained.

First, a conductive lead is formed on an alumina substrate. The conductive lead (a coil pattern in this embodiment) is formed by screen printing by applying a conductive paste made by mixing and kneading 78 parts by weight of an Ag powder which is a conductive component, 2 parts by weight of a glass powder and 2 parts by weight of an organic vehicle (ethylene glycol+ethyl cellulose) on the alumina substrate, drying the conductive paste, and firing the conductive paste at a temperature of 800° C. in air.

Then, a photosensitive glass paste is applied on the entire surface of the alumina substrate provided with a conductive lead by a screen printing technique and is then dried.

Exposure to ultraviolet light is then performed through a photomask having a via hole pattern so as to expose part of the conductive lead. By curing the part on which light is irradiated, an insulating layer (glass layer) is formed.

Development is then performed in an aqueous 0.6 percent by weight $Na_2CO_3$ solution so as to form via holes on part of the first insulating layer. Subsequently, firing at a temperature of 800° C. is performed in air so as to form a first insulating layer.

On the first insulating layer, a conductive paste identical to the one used in formation of the conductive lead is applied by screen-printing using a screen sheet having a desired pattern. By this process, via holes are filled with the conductive paste, a conductive lead pattern is formed on the first insulating layer, and the circuit on the first and the second layers are connected in series. Drying and firing steps under the above-described conditions follow this step.

Then, for the second insulating layer, the photosensitive glass paste is applied on the entire surface by screen-printing. Then the same exposure, development and firing steps are repeated as those for the first insulating layer, so as to form the second insulating layer. By repeating the above-described steps, a multilayered interconnected circuit board having a desired number of layers is manufactured.

Evaluation

For the multilayered interconnected circuit boards having via holes manufactured by using each of the above-described photosensitive glass pastes, the diameter of the via holes after development and after firing, the amount of Ag which is the conductor diffused, and sinterability are evaluated, and the results are shown in Table 4.

TABLE 4

| Sample | Via Hole Diameter after Development | Via Hole Diameter after Firing | Ag Diffusion | Sinterability |
|---|---|---|---|---|
| A* | 32 μm | 35 μm | I | III |
| B | 34 μm | 48 μm | I | II |
| C | 31 μm | 52 μm | I | I |
| D* | 32 μm | 87 μm | II | I |
| E | 30 μm | 56 μm | I | I |
| F* | 27 μm | 88 μm | II | I |
| G | 30 μm | 55 μm | I | I |
| H | 27 μm | 58 μm | II | I |
| I* | 32 μm | 90 μm | III | I |
| J* | 33 μm | 127 μm | III | I |

Ag Diffusion
I: Slightly Diffused
II: Diffusion Distance of approximately 10 mm
III: Diffusion Distance of 30 mm or more
Sinterability
I: Excellent
II: Satisfactory, No Insulation Failure
III: Insulation Failure Found As shown in Table 4, sample A having a low amount, i.e., 0.5 percent by weight, of the low melting point glass has inferior sinterability in the photosensitive glass paste. Although shrinkage was barely observed, insulation failures were found.

All samples B, C, D, E, F, G and H containing about 1 to 30 percent by weight of the low melting point glass were sintered. Except for samples D and F which used a high melting point glass in which the difference between the glass softening temperatures of the low melting point glass and that of the high melting point glass was less than about 300° C., the diameters of the via holes did not increase significantly in any of these samples.

In each of the samples B, C, D, E, F, G and H containing about 1 to 30 percent by weight of the low melting point glass, diffusion of Ag conductor into the glass was minimized. This was because diffusion of Ag into the high melting point glass contained therein was minimized.

In sample I which is outside the scope of the present invention (content of the low melting point glass: 35 percent by weight), not only the diameter of via holes was increased, but also diffusion of Ag into the insulating layer was increased resulting in a decrease of resistance in the insulating layer and insulation failure between layers. This was mainly because the amount of the low melting point glass (in which diffusion of Ag is likely to occur) added to the first high melting point glass, in which diffusion of Ag barely occurs, was too large.

In sample J containing a low melting point glass and no high melting point glass, the diameter of the via hole was increased, the shape of the via hole was distorted and the conductive lead which was supposed to have a coating thereon was instead exposed, thereby causing short circuiting failures between the leads when the conductor lead was formed.

Samples D and F use a high melting point glass having a glass softening temperature which is not more different than about 300° C. from the glass softening temperature ($T_S$) of the low melting point glass. In samples D and F, sintering was completed, but the via holes were enlarged and the pattern shape was distorted. As in sample J, the conductive lead which was supposed to have a coating thereon was instead exposed, and short circuit failure between leads occurred when the conductive leads of the second layer was formed.

Both samples C and D contain 2.5 percent by weight of the low melting point glass. However, sample D does not contain the second high melting point glass ($B_2O_3:Al_2O_3:SiO_2=96:2.5:1.4$). As a result, sample D had increased via hole diameter after firing compared to that of sample C. This is because sample C contained a glass having a high glass softening point and the second high melting point glass remains unmelted in the glass inhibiting the viscous flow of the glass, serving as anchorage, thereby preventing the via hole diameters from increasing.

Map diagrams were obtained using WDX (wavelength-dispersed X-ray spectrometer) showing the state of Ag diffusion in sample C, which is within the scope of the present invention and in sample I which is outside the scope of the present invention.

In the map diagrams, a part with a lighter color indicates a part with a high Ag concentration. In sample I, the sample which is outside the scope of the invention, the part with a lighter color is significantly large. Thus, the amount of diffused Ag is large and the insulation properties of the insulating layer is degraded.

It is to be understood that the scope of the present invention is not limited to the above-described embodiments and examples, and various applications and modifications are possible without departing from the spirit of the present invention.

What is claimed is:

1. A photosensitive glass paste comprising:
   an inorganic component comprising a glass powder; and
   a photosensitive organic component, wherein the glass powder comprises:
   (a) about 1 to 30 percent by weight of a low melting point glass powder having a glass softening point in the range of about 400° C. to 600° C.; and
   (b) about 70 to 99 percent by weight of high melting point glass powder having a glass softening point at least about 300° C. higher than the glass softening point of the low melting point glass.

2. A photosensitive glass paste according to claim 1, wherein the high melting point glass powder comprises a $SiO_2$—$B_2O_3$—$K_2O$ glass powder in which the composition of $SiO_2$, $B_2O_3$ and $K_2O$ by weight is within a region surrounded by point A (65, 35, 0), point B (65, 25, 10), point C (85, 5, 10) and point D (85, 15, 0) in a ternary diagram thereof.

3. A photosensitive glass powder according to claim 2, wherein the high melting point glass powder comprises a mixed powder of said $SiO_2$—$B_2O_3$—$K_2O$ glass and a $SiO_2$—$B_2O_3$—$Al_2O_3$ glass having a composition of:
   about 93.5 to 97.8 percent by weight $SiO_2$,
   about 2.0 to 5.0 percent by weight $B_2O_3$, and
   about 0.2 to 1.5 percent by weight $Al_2O_3$.

4. A photosensitive glass paste according to claim 3, wherein the mixed powder contains about 15 to 35 percent by weight of $SiO_2$—$B_2O_3$—$Al_2O_3$ glass relative to 100 percent by weight of the $SiO_2$—$B_2O_3$—$K_2O$ glass.

5. A photosensitive glass paste according to claim 1, wherein the high melting point glass powder comprises a $SiO_2$—$B_2O_3$—$K_2O$ glass powder in which the composition of $SiO_2$, $B_2O_3$ and $K_2O$ by weight is within a region surrounded by point E (75, 25, 0), point F (75, 20, 5), point G (85, 10, 5) and point D (85, 15, 0) in a ternary diagram thereof.

6. A photosensitive glass paste according to claim 1, wherein the content of the inorganic component is in a range of about 40 to 70 percent by weight.

7. A photosensitive glass paste according to claim 6, wherein the content of the inorganic component is in a range of about 50 to 55 percent by weight.

8. A photosensitive glass paste according to claim 1, wherein the low melting point glass powder has a glass melting point in a range of about 450° C. to 550° C.

9. A photosensitive glass paste according to claim 1, wherein the average grain diameter of the high melting point glass powder and of the low melting point glass powder are both in a range of about 0.1 to 10 μm.

10. A photosensitive glass paste according to claim 9, wherein the average grain diameter of the high melting point glass powder and of the low melting point glass powder are both in a range of about 1 to 4 μm.

11. A photosensitive glass paste according to claim 1, wherein about 10 to 25 percent by weight of the inorganic component comprises a ceramic powder.

12. A photosensitive glass paste according to claim 11, wherein the content of the inorganic component is in a range of about 40 to 70 percent by weight;
   the low melting point glass powder has a glass melting point in a range of about 450° C. to 550° C.;
   the high melting point glass powder comprises a mixed powder of 100 weight parts of a $SiO_2$—$B_2O_3$—$K_2O$ glass in which the composition of $SiO_2$, $B_2O_3$ a and $K_2O$ by weight is within a region surrounded by point A (65, 35, 0), point B (65, 25, 10), point C (85, 5, 10) and point D (85, 15, 0) in a ternary diagram thereof and about 15 to 35 weight parts of a $SiO_2$—$B_2O_3$—$Al_2O_3$ glass having a composition of:
   about 93.5 to 97.8 percent by weight $SiO_2$,
   about 2.0 to 5.0 percent by weight $B_2O_3$, and
   about 0.2 to 1.5 percent by weight $Al_2O_3$; and wherein the average grain diameter of the high melting point glass powder and of the low melting point glass powder are both in a range of about 0.1 to 10 μm.

13. A photosensitive glass paste according to claim 1, wherein the content of the inorganic component is in a range of about 50 to 55 percent by weight;
   the high melting point glass powder comprises a mixed powder of 100 weight parts of a $SiO_2$—$B_2O_3$—$K_2O$ glass in which the composition of $SiO_2$, $B_2O_3$ and $K_2O$ by weight is within a region surrounded by E (75, 25, 0), point F (75, 20, 5), point G (85, 10, 5) and point D (85, 15, 0) in a ternary diagram thereof and about 20 to 30 weight parts of a $SiO_2$—$B_2O_3$—$Al_2O_3$ glass; and
   wherein the average grain diameter of the high melting point glass powder and of the low melting point glass powder are both in a range of about 1 to 4 μm.

* * * * *